United States Patent [19]

Mettoudi

[11] Patent Number: 4,926,142
[45] Date of Patent: May 15, 1990

[54] OSCILLATOR HAVING A DIELECTRIC RESONATOR, AND ELECTRONIC FREQUENCY TUNING USING A VARACTOR, IN PARTICULAR IN THE 22 GHZ RANGE

[75] Inventor: Isaac Mettoudi, Levallois Perret, France

[73] Assignee: Alcatel Thomson Faisceaux Hertziens, Levallois Perret Cedex, France

[21] Appl. No.: 181,010

[22] Filed: Apr. 13, 1988

[30] Foreign Application Priority Data

Apr. 15, 1987 [FR] France ................... 87 05359

[51] Int. Cl.⁵ .............................................. H03B 5/18
[52] U.S. Cl. ................... 331/99; 331/117 D; 331/177 V; 333/232; 333/238
[58] Field of Search ............ 331/96, 99, 107 SL, 331/117 D, 177 V; 333/232, 238

[56] References Cited

U.S. PATENT DOCUMENTS

| | | | |
|---|---|---|---|
| 4,357,582 | 11/1982 | Ishihara et al. | 331/117 D X |
| 4,477,788 | 10/1984 | Collinet et al. | 333/235 |
| 4,484,156 | 11/1984 | Khanna et al. | 331/117 D X |
| 4,618,836 | 10/1986 | Gannon et al. | 331/96 |
| 4,652,836 | 3/1987 | Accatino et al. | 331/117 D X |
| 4,733,199 | 3/1988 | Khanna | 331/99 |

FOREIGN PATENT DOCUMENTS 0137281 4/1985 European Pat. Off. .
2438937 5/1980 France .

OTHER PUBLICATIONS

Patent Abstracts of Japan, vol. 5, No. 40 (E-49), 712, Mar. 17, 1981; & JP-A-55 162 634 (Sony K.K.) 12/18/1980.

*Primary Examiner*—Siegfried H. Grimm
*Attorney, Agent, or Firm*—Sughrue, Mion, Zinn, Macpeak, and Seas

[57] ABSTRACT

An oscillator having a dielectric resonator and being electronically tuned in frequency by a varactor, in particular in the 22 GHz range, the oscillator comprising an active electronic component having negative resistance (17), at least two dielectric resonators (40, 41), and a substrate (13) on the surface of which there are three striplines (10, 11, 12), with the first and second striplines (10 and 11) being in line and having their adjacent ends connected to two respective electrodes of the active component (17). The third stripline (12) which runs parallel to the first two striplines (10, 11) is connected to the varactor (26), with all of the dielectric resonators (40, 41) being coupled to the first stripline (10).

12 Claims, 4 Drawing Sheets

OSCILLATOR HAVING A DIELECTRIC RESONATOR, AND ELECTRONIC FREQUENCY TUNING USING A VARACTOR, IN PARTICULAR IN THE 22 GHZ RANGE

Reference to Related Application

This appliction relates to appliction Ser. No. 181,011, filed Apr. 13, 1988, entitled "A microwave oscillator having a dielectric resonator, in particular for the 22 ghz range", to Issac Mettonati et al and assigned to the assignee.

The invention relates to an oscillator having a dielectric resonator and electronic frequency tuning by means of a varactor, in particular in the 22 GHz range (for example from 18 GHz to 24 GHz).

BACKGROUND OF THE INVENTION

Since the new generation of microwave links and mobile relays operate in the 22 GHz range, more and more high stability microwave sources are required having low consumption and low cost while also being capable of being electronically tuned in frequency.

The means used in the prior art consist in using a solid state component such as a gallium arsenide field effect transistor (GaAs FET) which is stabilized by means of a dielectric resonator, with the frequency of the oscillator being adjusted by displacing a disk immediately above the resonator.

However, when operating at about 22 GHz or above, it is necessary to use GaAs FET chips. In order to avoid the chips deteriorating over time, a vacuum must be set up inside the housing and an inert gas then inserted therein. It will readily be understood that it then becomes practically impossible to perform any mechanical adjustment after the oscillator has been assembled in equipment, in particular when the frequency of the oscillator varies over time, whence the necessity of using an oscillator having a transistor and a dielectric resonator which are capable of being tuned in frequency using a varactor.

When it is desired to vary the frequency of an oscillator having a transistor and a dielectric resonator, or when it is desired to modulate said oscillator, one of the means used consists in coupling a stripline to the main transmission line and in inserting a varactor on the coupled line. The dielectric resonator may be placed between the two lines.

In this technology, adjustment of the dielectric resonator serves simultaneously;
  to couple the varactor containing stripline to the main stripline;
  to determine the frequency of the oscillator; and
  to obtain optimum power output from the osoillator.

However, when operating at high frequencies, for example at about 22 GHz, an oscillator of this type becomes highly critical to implement and particularly difficult to adjust in mass production.

The object of the present invention is to mitigate these drawbacks.

SUMMARY OF THE INVENTION

The present invention provides an oscillator having a dielectric resonator and being electronically tuned in frequency by a varactor, in particular in the 22 GHz range, the oscillator comprising an active electronic component having negative resistance, at least two dielectric resonators, and a substrate on the surface of which there are three striplines, with the first and second striplines being in line and having their adjacent ends connected to two respective electrodes of the active component, wherein the third stripline which runs parallel to the first two striplines is connected to the varactor, with all of the dielectric resonators being coupled to the first stripline.

Advantageously, the first and third tracks have respective first ends coupled to two 50 ohm loads, and the second track has a first end coupled to a fourth line connected to a microwave output pin. The negative resistance active electronic component is a FET having two of its electrodes, the gate and the drain, connected to the respective second ends of the first and the second lines. The other electrodes of this transistor are welded to a small support situated in an oblong opening provided in the substrate.

In a first variant embodiment, the oscillator in accordance with the invention comprises two dielectric resonators respectively situated on either side of the first stripline track.

By using two dielectric resonators, it is possible to separate the functions of coupling and of frequency adjustment, thereby making adjustments easier and more flexible then in circuits using a single dielectric resonator.

In a second variant embodiment of the invention, the oscillator comprises three dielectric resonators disposed between the first and second stripline tracks.

Such an embodiment provides excellent coupling between the first and second striplines, and also improves the oscillator adjustment time.

In a particularly advantageous embodiment of the invention, the oscillator is mainly constituted by a housing having a substrate welded thereto, with the transistor chip being welded to a support, for example made of copper, and itself welded to the ground of the housing. The transistor is biased via sealed gate and drain feedthroughs. The third stripline having the varactor fixed thereto is coupled to the gate track by means of three dielectric resonators which also serve to determine the output frequency of the oscillator. On top of the housing there is a lid having a tapped hole constituting a chimney. The tapped hole has a double-threaded screw screwed therein with an adjustable self-locking screw fixed in the double-threaded screw.

BRIEF DESCRIPTION OF THE DRAWINGS

Embodiments of the invention are described by way of example with reference to the accompanying drawings, in which.

MORE DETAILED DESCRIPTION

Figure 1:
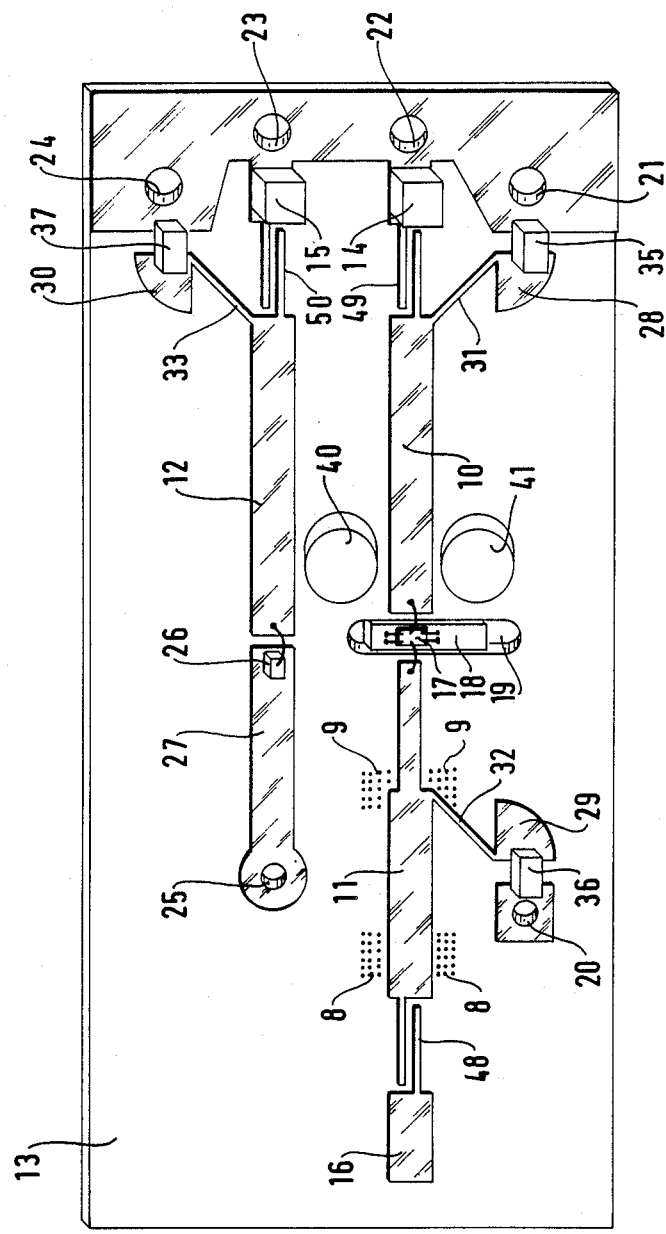
FIG. 1 is a fragmentary diagram of an oscillator in accordance with the invention.

The oscillator shown in FIG. 1 comprises three stripline tracks 10, 11, and 12 disposed on the surface of a substrate 13. The first two tracks 10 and 11 are in line with each other and the third track 12 is parallel thereto.

The first and third tracks 10 and 12 have their respective first ends coupled to two 50-ohm loads 14 and 15, and the second track has a first end coupled to a fourth line 16 connected to a microwave output pin (not shown in the figure).

An active electronic component 17 having negative resistance, for example a gallium arsenide field effect transistor (GaAs FET) has two of its electrodes, its gate and its drain, connected to respective second ends of the first and second lines 10 and 11. The other electrodes of the transistor 17 are welded to a small support 18 situated in an oblong opening 19 made through the substrate 13.

Holes 20, 21, 22, 23, 24, and 25 are plated-through holes providing connections to the ground plane situated on the other face of the substrate.

A variable capacitance diode 26, or varactor, has one end connected to the second end of the third track 12 and has its other end connected to ground via track portion 27 and plated-through hole 25.

Three bias circuits, each constituted by a quarter circle low impedance line 28, 29, or 30 and by a high impedance line 31, 32, or 33 for ensuring that these circuits have negligible effect at working frequencies serve respectively:
  to bias the gate (lines 28 and 31);
  to bias the drain (lines 29 and 32); and
  to bias the varactor (lines 30 and 33).

Decoupling capacitors 35, 36, and 37 are connected between the low impedance lines 28, 29, and 30 and plated-through holes 21, 20, and 24.

Two dielectric resonators 40 and 41 are situated on either side of the first stripline 10 which is connected to the gate of transistor 17.

Impedance adjusting zones 8 and 9 constituted by depositing silver varnish serve as tuning stubs at two different locations along the second stripline 11.

In this configuration shown in FIG. 1, the first dielectric resonator 40 situated between the first stripline 10 connected to the gate of the FET 17 and the third stripline 12 containing the varactor 26 serves to provide appropriate coupling between the varactor 26 and the transistor 17.

The second dielectric resonator 41 situated on the other side of the first stripline 10 connected to the transistor 17 serves to provide appropriate adjustment of the output frequency from the oscillator.

By using two dielectric resonators 40 and 41 and thereby to some extent separating the functions of coupling and of frequency adjustment, it is possible to obtain frequency adjustment which is more flexible and easier to perform than in circuits using only one dielectric resonator. By varying the height H of the second dielectric resonator 41, it is possible to increase or decrease the output frequency without needing to tweak the first resonator 40. The resonant frequency of the resonator increases with reducing height.

Figure 3:
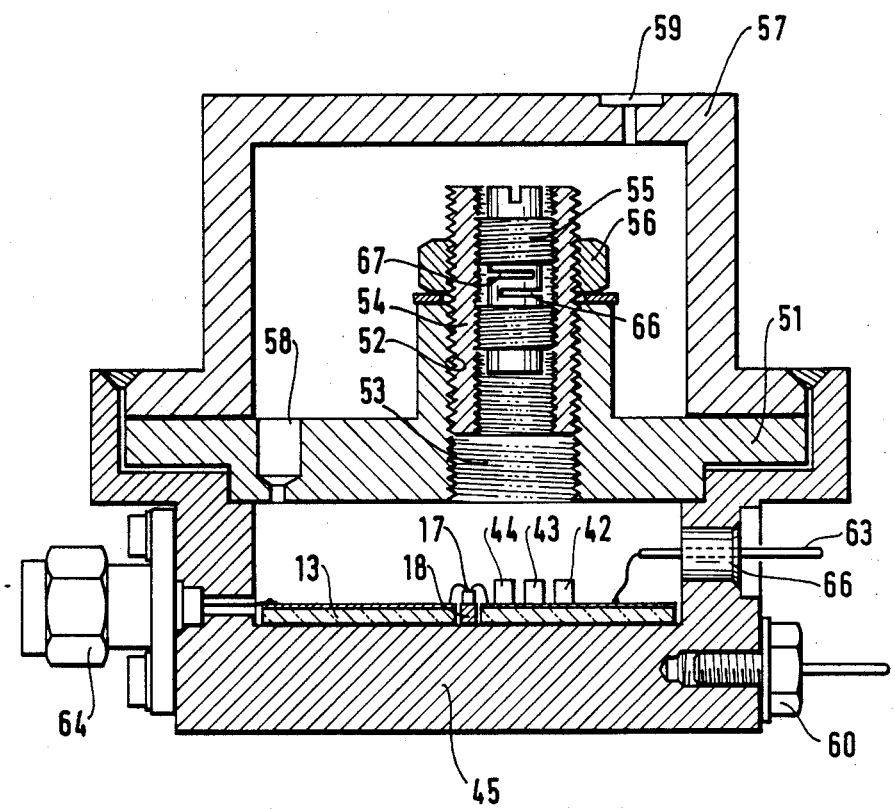
FIG. 3 is a section through the FIG. 2 oscillator when installed in its housing.

Additional adjustment of the oscillator frequency can be obtained by using a chimney device as shown in FIG. 3 and described below.

Figure 2:
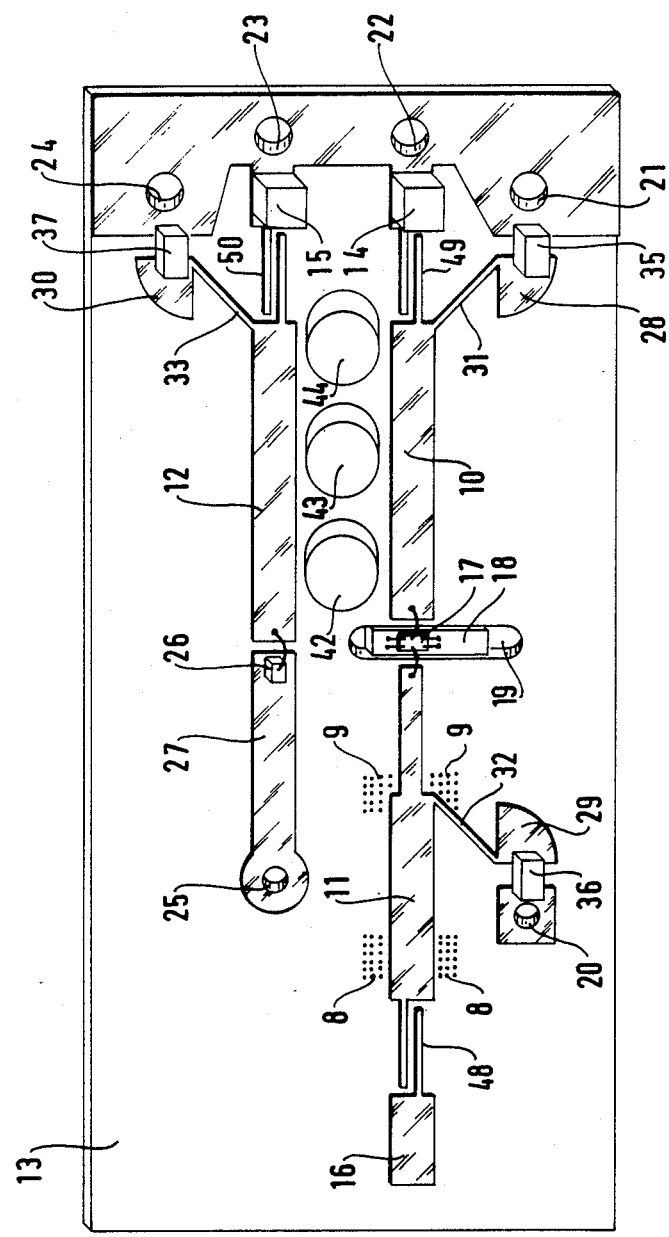
FIG. 2 is a fragmentary diagram of a variant oscillator in accordance with the invention.
Figure 4:
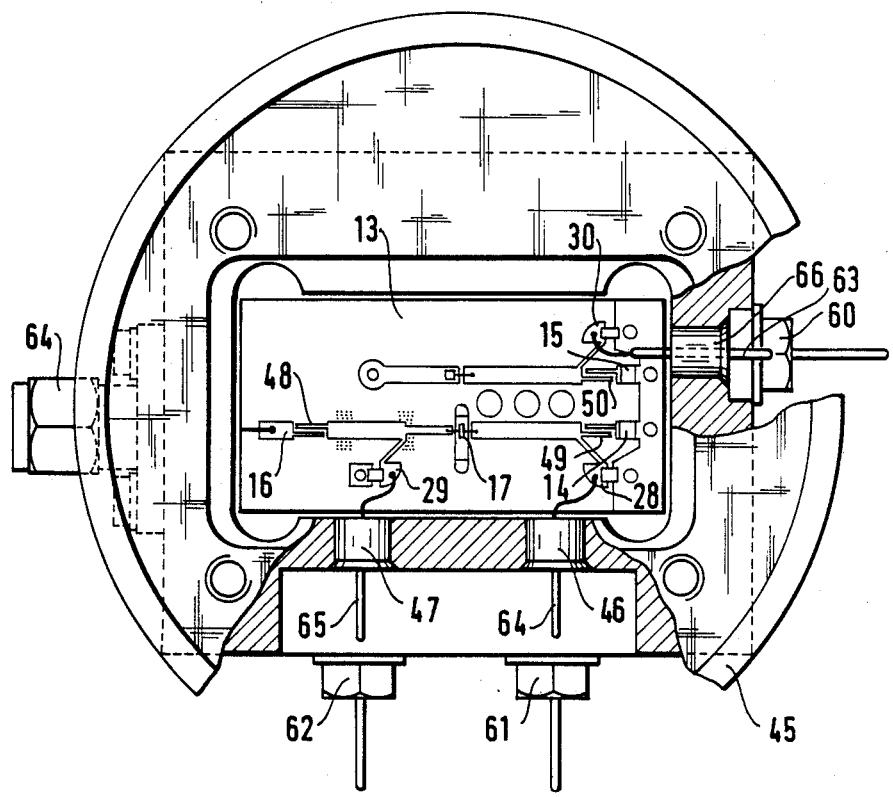
FIG. 4 is a partially cut-away fragmentary plan view of an oscillator as shown in FIG. 3 and installed in its housing.

A variant embodiment of the invention providing a very great deal of flexibility in adjustment and excellent varactor coupling in the 22 GHz band, for example, consists in using the oscillator shown in FIGS. 2, 3, and 4.

This configuration differs from that shown in FIG. 1 in that it uses three resonators 42, 43, and 44.

These three dielectric resonators 42, 43, and 44 have the same diameter and the same height and serve to determine the frequency of the oscillator.

These three dielectric resonators are coupled to one another and also serve to couple the third stripline 12 containing the varactor to the first stripline 10 connected to the gate of transistor 17.

Additional adjustment of the oscillator frequency can be obtained by using the chimney device shown in FIG. 3.

The dielectric resonator and varactor oscillator shown in FIGS. 3 and 4 is mainly constituted by a housing 45 made of "DILVER" for example, with a substrate 13 welded thereon, for example a plate of quartz. DILVER and quartz have compatible coefficients of expansion.

An oblong opening 19 is formed through the quartz substrate. The GaAs FET in the form of a chip is welded to the support 18, which may be made of copper for example, which is situated in said opening 19. This support is itself welded to the ground of the housing 45 for the purpose of ensuring good heat dissipation for the transistor 17.

The transistor 17 may be connected, for example, in a common source configuration. The drain is then connected to the second or "drain" stripline 11. The gate is connected to the first or "gate" stripline 10. The transistor is biased by means of sealed gate and drain feedthroughs 46 and 47. The third stripline 12 having the varactor 26 fixed is coupled to the gate line by the three dielectric resonators 42, 43, and 44 which also serve to determine the output frequency of the oscillator. The varactor 26 is biased via a sealed feedthrough 66.

The gate and varactor tracks 10 and 12 are terminated at one end by respective 50-ohm loads. Gaps 48, 49, and 50 constitute tuning gaps and isolate the transistor 17 and the varactor 26 from the two 50-ohm loads 14 and 15.

Above the housing 45 there is a lid 51 which is also made of "DILVER", for example. The lid 51 includes a chimney 53 with a tapped hole 52 machined therein. A double-threaded screw 54 is screwed into the tapped hole 52 and an adjustable and self-locking screw 55 is screwed into the screw 54, with the screw 55 being provided with two transverse notched 67 and 68. The double-threaded screw 54 is locked into position by means of a lock nut 56.

This chimney device constitutes a means for adjusting the output frequency of the oscillator and enables the field lines above dielectric resonators 42, 43, and 44 to be disengaged.

After the oscillator has been adjusted, a cover 57 is welded to the housing, e.g. by laser welding, and the assembly is made gasproof by being evacuated and then injecting an inert gas into the housing. The lid 51 and the cover 57 are provided with respective orifices 58 and 59 for this purpose.

This operation is performed to protect the transistor and to obtain more stable oscillator characteristics over time.

Various output pins 60, 61, 62, 63, 64, 64, and 65 are shown and they serve respectively as follows:
  three ground pins 60, 61, and 62;
  a varactor bias pin 63 connected to track 30;
  a gate bias pin 64 connected to track 28;
  a drain bias pin 65 connect to track 29; and
  the oscillator output pin 64 connected to track 16.

Naturally the present invention has merely been shown by way of preferred example and its component parts could be replaced by equivalent parts without going beyond the scope of the invention.

For example the oscillator as shown in FIGS. 3 and 4 could equally well have been based on the circuit shown in FIG. 1.

I claim:

1. An oscillator having a dielectric resonator and being electronically tuned in frequency by a varactor, in particular in the 22 GHz range, the oscillator comprising an active electronic component having negative resistance, at least two dielectric resonators, and a substrate on the surface of which there are three striplines, with the first and second striplines being in line and having their adjacent ends connected to two respective electrodes of the active component, wherein the third stripline which runs parallel to the first two striplines is connected to the varactor, with all of the dielectric resonators being coupled to the first stripline.

2. An oscillator according to claim 1, wherein the active electronic component having negative resistance is a field effect transistor, with the first stripline being connected to the gate of the transistor and the second stripline being connected to the drain of the transistor.

3. An oscillator according to claim 2, wherein each of the first and third striplines has a first end coupled to a respective 50-ohm load, with the second stripline having a first end coupled to a fourth stripline connected to a microwave output pin, the transistor having two of its electrodes, namely its gate and its drain, connected to respective second ends of the first and second striplines, and having its other electrodes welded to a small support situated in an opening provided in the substrate.

4. An oscillator according to claim 3, wherein three bias circuits each constituted by a quarter circle low impedance line and a high impedance line serve respectively:

to bias the gate;
to bias the drain; and
to bias the varactor.

5. An oscillator according to claim 1, wherein two dielectric resonators are disposed on either side of the first stripline.

6. An oscillator according to claim 1, wherein three dielectric resonators are disposed between the first stripline and the third stripline.

7. An oscillator according to claim 2, including a housing having the substrate welded therein, with the transistor being welded to a support which is itself welded to the ground of the housing, with the transistor being biased via sealed gate and drain feedthroughs, and with the third stripline to which a varactor is fixed being coupled to the gate stripline via at least one dielectric resonator.

8. An oscillator according to claim 7, wherein a lid is provided over the housing, said lid including a chimney having a tapped hole running therealong and receiving a double-threaded screw, with a self-locking and adjustable screw being received in the double-threaded screw, the double-threaded screw being locked by means of a lock nut.

9. An oscillator according to claim 8, wherein a cover is fixed to the housing so as to provide a sealed assembly.

10. An oscillator according to claim 8, wherein the housing and its lid are made of "DILVER" and wherein the substrate is made of quartz.

11. An oscillator according to claim 7, wherein the support of the transistor is made of copper.

12. An oscillator according to claim 2, wherein the transistor is a GaAs FET.

* * * * *